United States Patent
Wright, Jr. et al.

(10) Patent No.: US 11,560,625 B2
(45) Date of Patent: Jan. 24, 2023

(54) VAPOR DEPOSITION OF MOLYBDENUM USING A BIS(ALKYL-ARENE) MOLYBDENUM PRECURSOR

(71) Applicant: ENTEGRIS, INC., Billerica, MA (US)

(72) Inventors: Robert Wright, Jr., Newtown, CT (US); Shuang Meng, Fremont, CA (US); Bryan C. Hendrix, Danbury, CT (US); Thomas H. Baum, New Fairfield, CT (US); Philip S. H. Chen, Bethel, CT (US)

(73) Assignee: ENTEGRIS, INC., Billerica, MA (US)

( * ) Notice: Subject to any disclaimer, the term of this patent is extended or adjusted under 35 U.S.C. 154(b) by 21 days.

(21) Appl. No.: 16/245,791

(22) Filed: Jan. 11, 2019

(65) Prior Publication Data

US 2019/0226086 A1    Jul. 25, 2019

Related U.S. Application Data

(60) Provisional application No. 62/619,363, filed on Jan. 19, 2018.

(51) Int. Cl.
*C23C 16/455* (2006.01)
*C23C 16/32* (2006.01)
*C23C 16/08* (2006.01)

(52) U.S. Cl.
CPC ........ *C23C 16/45553* (2013.01); *C23C 16/08* (2013.01); *C23C 16/32* (2013.01)

(58) Field of Classification Search
None
See application file for complete search history.

(56) References Cited

U.S. PATENT DOCUMENTS

| | | | |
|---|---|---|---|
| 7,405,143 B2 * | 7/2008 | Leinikka | H01L 21/76843 427/126.1 |
| 10,287,681 B2 | 5/2019 | Lee | |
| 2005/0166833 A1 | 8/2005 | Norikane | |
| 2009/0202742 A1 | 8/2009 | Meiere | |
| 2013/0196065 A1 | 8/2013 | Heys | |
| 2015/0105241 A1 | 4/2015 | Roman-Leshkov | |
| 2016/0002786 A1 | 1/2016 | Gatineau | |
| 2017/0330748 A1 | 11/2017 | Pickett | |
| 2018/0019165 A1 | 1/2018 | Baum et al. | |
| 2018/0019166 A1 | 1/2018 | Cheng | |

(Continued)

FOREIGN PATENT DOCUMENTS

| | | |
|---|---|---|
| CN | 1463309 A | 12/2003 |
| KR | 20150015183 A | 2/2015 |

(Continued)

OTHER PUBLICATIONS

Bertuch (J. Vac. Sci. Technol. A 34, 051403 (2016)) (Year: 2016).*

(Continued)

*Primary Examiner* — Joel G Horning

(57) ABSTRACT

Described are vapor deposition methods for depositing molybdenum materials onto a substrate by the use of bis (alkyl-arene) molybdenum, also referred to herein as (alkyl-arene)$_2$Mo, for example bis(ethyl-benzene) molybdenum ((EtBz)$_2$Mo), as a precursor for such deposition, as well as structures that contain the deposited material.

17 Claims, 2 Drawing Sheets

(56) References Cited

U.S. PATENT DOCUMENTS

2018/0312966 A1* 11/2018 Chan .................. C23C 16/00
2019/0067016 A1* 2/2019 Zhu .................. C23C 16/045

FOREIGN PATENT DOCUMENTS

| KR | 20150084757 A | 7/2015 |
|---|---|---|
| TW | 200829509 A | 7/2008 |
| WO | 2017103546 A1 | 6/2017 |
| WO | 2018013778 A1 | 1/2018 |

OTHER PUBLICATIONS

Drake (J. Vac. Sci. Technol. A 34, 051403 (2016)). (Year: 2016).*
Park, Jae Min, A study on the atomic layer deposition of copper nitride film and its application to seed layer of copper interconnect, Sejong University Graduate School, Nanotechnology and Advanced Materials Engineering, 2013 See pp. 65-66. (Copy not available online).
Park, Jae Min, A study on the atomic layer deposition of copper nitride film and its application to seed layer of copper interconnect, Sejong University Graduate School, Nanotechnology and Advanced Materials Engineering, 2013 (Partial translation enclosed).
Buijnsters et al., "Enhancement of the Nucleation of Smooth and Dense Nanocrystalline Diamond Films by Using Molybdenum Seed Layers", Journal of Applied Physics, pp. 103514-1 to 103514-9, Nov. 19, 2010.
Grady et al., "Resist and Transfer Free Patterned CVD Graphene Growth on ALD MoCx Nano Layers", Physics, pp. 1-14, Nov. 15, 2019.
ХИМИЯ ЭЛ emehtoopГ ah ИЧЕСКИХ Сое ДV heh ИЙ (Chemistry of Organic Compounds), 1982, pp. 78-84.
Correspondence issued in Japanese counterpart application No. 2020-539718, which explains relevance of NPL3, Chemistry of Organic Compounds, 1982, Dec. 28, 2021 (6 pages).
Office Action Issued in Chinese Counterpart Application No. 201980009112.4, Jae-Min Park et al.,Characteristics of Molybdenum thin films deposited by chemical vapor deposition, Conference: Fall Conference of KSDT, abstract, 2013, and correspondence re relevance and English translation of same (13 pages).

* cited by examiner

VAPOR DEPOSITION OF MOLYBDENUM USING A BIS(ALKYL-ARENE) MOLYBDENUM PRECURSOR

CROSS-REFERENCE TO RELATED APPLICATIONS

This application claims the benefit under 35 USC 119 of U.S. Provisional Patent Application No. 62/619,363, filed Jan. 19, 2018, the disclosure of which is hereby incorporated herein by reference in its entirety for all purposes.

FIELD OF THE INVENTION

The present disclosure relates to vapor deposition methods for depositing a molybdenum-containing material onto a substrate by the use of bis(alkyl-arene) molybdenum, also referred to herein as (alkyl-arene)$_2$Mo, for example bis (ethyl-benzene) molybdenum ((EtBz)$_2$Mo), as a precursor for such deposition.

BACKGROUND

Semiconductor and microelectronic devices, and methods of preparing these devices, involve metals and metal-containing materials used in device structures such as electrodes, vias, barrier layers, interconnects, seed layers, and various other structures. During fabrication, the metal or metal-containing material is placed onto the device by deposition, meaning for example by atomic layer deposition, chemical vapor deposition, or a modification or derivative thereof. The deposited material is provided to the deposition process in the form of a "precursor," which may be an inorganic or organometallic reagent that when vaporized and exposed to a substrate under the correct conditions will become deposited, alone or in combination with another material, onto the substrate.

One metal that is commonly used for conductive structures is tungsten. According to common methods of depositing tungsten, tungsten hexafluoride (WF$_6$) is used as a precursor from which the deposited tungsten is derived. A disadvantage of tungsten deposited by use of tungsten hexafluoride is that fluorine reacts with hydrogen (H$_2$) to form hydrogen fluoride (HF), which can be detrimental to a substrate, e.g., by causing etching of a silicon wafer.

Molybdenum is a low-resistivity refractory metal that has been used in microelectronic devices, e.g., as an alternative to tungsten. Molybdenum has a high melting point, high thermal conductivity, a low coefficient of thermal expansion, and low electrical resistivity. Molybdenum has been used or proposed for use as a diffusion barrier, electrode, photomask, interconnect, or as a low-resistivity gate structure. Molybdenum is a candidate for replacing tungsten used in memory chips, logic chips, and other devices that include polysilicon-metal gate electrode structures. A thin film that contains molybdenum can also be used in some organic light emitting diodes, liquid crystal displays, and also in thin film solar cells and photovoltaics.

Various precursor materials and vapor deposition techniques have been used for depositing metal materials onto microelectronic device substrates. Deposition techniques can include chemical vapor deposition (CVD) and atomic layer deposition (ALD) as well as a number of modifications of these processes such as UV laser photo-dissociation CVD, plasma-assisted CVD, and plasma-assisted ALD. CVD and ALD processes are being increasingly used in the microelectronics industry because these methods may allow excellent conformal step coverage on highly non-planar microelectronic device geometries.

Researchers in the semiconductor and microelectronics industries are in continuous search for improved materials and methods for depositing metals onto substrates to provide useful metal or metal-containing layers and structures. Currently, researchers are interested in methods and materials that avoid tungsten hexafluoride, including the use of metals other than tungsten, for example molybdenum. Some materials and techniques useful for chemical vapor deposition of molybdenum have been described. See, for example, International patent publication WO2017/143246 (PCT/US2017/018455). Research efforts continue toward identifying still other useful materials and techniques for use in vapor deposition methods for depositing molybdenum onto microelectronic device substrates.

SUMMARY

According to the following description, Applicant has determined that a molybdenum material can be deposited onto surfaces of microelectronic substrates by use of a bis(alkyl-arene) molybdenum compound, also referred to herein as (alkyl-arene)$_2$Mo, for example bis(ethyl-benzene) molybdenum ((EtBz)$_2$Mo), as a molybdenum precursor in a deposition process. The molybdenum may be deposited as any form or structure that will be useful as part of a microelectronic device substrate, for example as a seed layer that contains molybdenum in combination with another material (e.g., carbon, to form molybdenum carbide), or as a conductive bulk molybdenum structure (i.e., elemental molybdenum).

Other potential molybdenum precursors under development, such as molybdenum halide and oxyhalide precursors, have been shown to be effective to deposit very high purity, metallic, molybdenum films with very low resistivity. But, nucleation of a metallic molybdenum film onto titanium nitride or other desired substrate surfaces, using these precursors, has been found to be potentially limited. A seed layer or nucleation layer that would improve nucleation of metallic molybdenum onto a substrate, from a molybdenum halide and oxyhalide precursor, would be desirable to facilitate the use of these precursors for depositing very high purity, metallic molybdenum films with very low resistivity.

According to described vapor deposition methods, a molybdenum material can be deposited onto a surface of a substrate by contacting the substrate with vapor derived from (alkyl-arene)$_2$Mo, e.g., (EtBz)$_2$Mo, under vapor deposition conditions. In particular embodiments, the deposited molybdenum material is molybdenum carbide deposited as a seed layer onto which a subsequent layer of bulk (elemental) molybdenum is applied. A seed layer of molybdenum carbide deposited using (EtBz)$_2$Mo precursor can be applied at a relatively low temperature, e.g., below 300 degrees Celsius, or below 250 or 270 degrees Celsius, with the molybdenum carbide seed layer having good conformality when applied to a three-dimensional structure. According to example structures and methods, molybdenum carbide can be applied to a titanium nitride surface of a three-dimensional substrate as a seed layer that provides protection in the form of etch resistance to the titanium nitride material during a subsequent step of depositing elemental molybdenum by use of a halide precursor. A molybdenum carbide seed layer applied using (EtBz)$_2$Mo precursor also allows for relatively lower or reduced temperatures during a subsequent (immediately next) step of depositing elemental molybdenum, which results in improved conformal filling of a complicated structure such as a high aspect ratio three-dimensional structure or opening, e.g., a via or interconnect. For example, a temperature of a substrate during a subsequent step of depositing metallic molybdenum may be at least 50 degrees Celsius lower than a temperature that would be required to deposit the metallic molybdenum onto a substrate that does not include the molybdenum carbide seed layer.

According to one example method of preparing a conformal molybdenum coating on a three-dimensional substrate, with the substrate containing surfaces of titanium nitride, a molybdenum carbide seed layer is deposited onto the titanium nitride surface by use of a $(EtBz)_2Mo$ precursor. In a following step, bulk (elemental) molybdenum is applied to the seed layer by use of any desired or useful precursor, such as $MoOCl_4$, $MoCl_5$, or $MoF_6$. The step of depositing the seed layer can be performed at a deposition temperature (i.e., the substrate temperature) of below 300 or below 250 or 270 degrees Celsius. The step of depositing the bulk (elemental) molybdenum can be performed at a deposition temperature (i.e., the substrate temperature) of below 500 or below 450 degrees Celsius, although higher temperatures can be useful if desired. The seed layer and the bulk (elemental) molybdenum layer exhibit good uniformity and conformality, even when applied to a highly three-dimensional surface, such as a high aspect ratio surface.

As used herein, "vapor deposition" process refers to any type of vapor deposition technique such as CVD or ALD. In various embodiments, CVD may take the form of conventional (i.e., continuous flow) CVD, liquid injection CVD, or photo-assisted CVD. CVD may also take the form of a pulsed technique, i.e., pulsed CVD. In other embodiments, ALD may take the form of conventional (e.g., pulsed injection) ALD, special ALD, liquid injection ALD, photo-assisted ALD, or plasma-assisted ALD.

In one aspect, the invention relates to a method of forming a molybdenum-containing material on a substrate. The method includes contacting the substrate with bis(alkyl-arene) molybdenum (i.e., (alkyl-arene)$_2$Mo) vapor under vapor deposition conditions, to deposit the molybdenum-containing material on the substrate.

DETAILED DESCRIPTION

Figure 1:
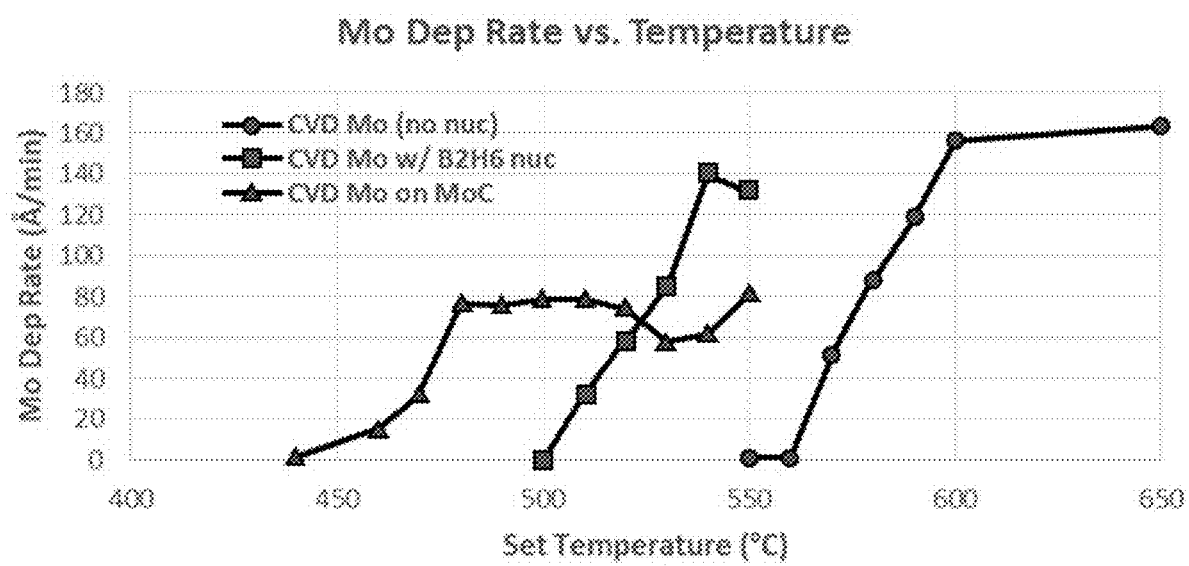
FIG. 1 illustrates a comparison of deposition rates of molybdenum from $MoOCl_4$ onto substrates with various surface compositions, including one surface of molybdenum carbide as described.

The following description relates to vapor deposition methods useful for depositing molybdenum, in various forms, onto a substrate, by the use of a bis(alkyl-arene) molybdenum compound as a molybdenum precursor. Bis(alkyl-arene) molybdenum compounds (complexes) are also referred to herein as (alkyl-arene)$_2$Mo compounds. One example of a species of this class of compounds found to be useful as a precursor is bis(ethyl-benzene) molybdenum (i.e., $(EtBz)_2Mo$). The precursor can be used in a vapor deposition (e.g., chemical vapor deposition) process to deposit molybdenum onto a substrate in any form, e.g., as a compound or mixture that contains molybdenum, such as in the form of a seed layer of molybdenum carbide; as elemental molybdenum in the form of a conductive structure; or as another deposited material that contains molybdenum.

Chemical vapor deposition (CVD) generally is a chemical process by which a chemical material (derived from a "precursor"), optionally in combination with one or more other materials such as a co-reactant, is introduced as a vapor, to a substrate, under conditions that will cause components of the vapor to form a thin film of material on a surface of the substrate.

If necessary or desired, a co-reactant such as a reducing gas (referred to herein as a "reactant gas"), e.g., hydrogen, is introduced into the deposition chamber along with the precursor to facilitate deposition of molybdenum in a desired form. The amount, i.e., flow rate, of the reactant gas provided to the deposition chamber can be as desired and as effective to produce a desired form of molybdenum material deposited at the substrate surface, with a flow rate for a particular deposition process being selected in combination with other parameters of the deposition process such as a flow rate of precursor, substrate temperature, and chamber pressure.

According to the present description, molybdenum precursor, along with optional reactant gas, can be placed in a deposition chamber that contains a substrate, to effect vapor deposition of molybdenum onto the substrate. The conditions of the deposition chamber will cause molybdenum from the precursor to become deposited onto the substrate in a desired form and amount. For example, hydrogen as reactant gas, and the molybdenum precursor, may combine (e.g., react) in a manner that results in molybdenum derived from the molybdenum precursor being deposited onto a surface of the substrate. In certain example methods, the molybdenum precursor may combine with the hydrogen reactant gas by a reaction that causes deposition of molybdenum carbide, i.e., molybdenum and carbon with the crystallographic structure of $Mo_2C$ or MoC. In other example methods, the molybdenum precursor may combine with hydrogen reactant gas by a reaction that causes deposition of elemental (metallic) molybdenum, i.e., molybdenum with a crystal structure of Mo.

Commonly, precursor, as a vapor, can be carried to the deposition chamber by use of a carrier gas, which may be an inert gas such as helium, argon, nitrogen, neon, xenon, krypton, or a combination thereof. The carrier gas can be passed through a closed container (e.g., a closed vessel or "ampoule") that contains an amount of the precursor, e.g., in liquid form. As the carrier gas passes through the container, precursor vapor is carried with the carrier gas, and the combination (a "carrier gas-precursor mixture") can be provided to the deposition chamber. The carrier gas-precursor mixture delivered to the deposition chamber can comprise, consist of, or consist essentially of carrier gas and precursor (as a vapor).

A substrate of a process as described, onto which molybdenum is deposited, can be any substrate, having surfaces that are either three-dimensional or two-dimensional, such as a two-dimensional or three-dimensional microelectronic or semiconductor device. According to certain currently-useful methods, example methods as described can be particularly useful for applying molybdenum onto three-dimensional substrate surfaces, including to coat surfaces of the substrate, or to fill a high aspect ratio three-dimensional opening. In example methods, the molybdenum may be deposited onto a three-dimensional substrate as an electrically conducting seed layer of molybdenum carbide. Elemental (metallic) molybdenum, which may be derived from any precursor, preferably from a molybdenum halide or molybdenum oxyhalide precursor, may then be deposited onto the seed layer as elemental (metallic) molybdenum in the form of a conductive structure.

The precursor compounds described herein, bis(alkyl-arene) molybdenum compounds (or "complexes") (also referred to herein as (alkyl-arene)$_2$Mo), are of a class of compounds also known as bis($\eta^6$-arene)molybdenum complexes, which includes compounds that have an alkyl substituent on an aryl (e.g., benzene) group of the complex. Examples of these complexes may be synthesized by known methods, including metathesis of the arene ligands of bis ($\eta^6$-benzene)molybdenum, among other techniques. See: *Synthesis of Bis($\eta^6$-alkylbenzene)molybdenum by Arene Metathesis*, Victor S. Asirvatham and Michael T. Ashby, Organometallics, 2001, 20(8), pp 1687-1688, DOI: 10.1021/om001010b, Publication Date (Web): Mar. 15, 2001.

These precursor compounds can be represented as having a structure that includes a first substituted aryl group (e.g., alkyl benzene) associated with a molybdenum atom on a first side of the molybdenum atom, and a second substituted aryl group (e.g., alkylbenzene) associated with the molybdenum atom on a second side of the same molybdenum atom. The compounds, or complexes, include a single molybdenum atom surrounded on opposite sides by two alkyl-substituted arene compounds. The compounds, having one molybdenum atom located between two substituted arene compounds, are sometimes referred to as "sandwich" structures:

Arene(R)-Mo-Arene(R)

Each arene compound may be substituted with the same or a different alkyl group R. Each alkyl group (R) may, for example, independently be a methyl, ethyl, propyl, butyl, etc., and may be branched or straight. One example precursor is bis(ethyl-benzene) molybdenum (i.e., (EtBz)$_2$Mo):

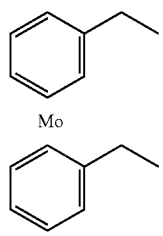

This compound is commercially available in amounts and forms (i.e., having a purity) useful as a precursor as described.

In certain presently-preferred example methods, the precursor may be deposited onto a substrate to form a seed layer of molybdenum carbide. A seed layer is a layer that contains molybdenum, e.g., molybdenum carbide, and that is effective to facilitate subsequent deposition of a bulk, metallic, conductive molybdenum layer onto a substrate. A seed layer should be continuous over an entire surface of a substrate onto which a bulk molybdenum material (e.g., elemental (metallic) molybdenum) will be deposited, and should allow a subsequent step of bulk deposition of molybdenum to cover or fill an entire surface of a substrate, preferably to allow nucleation and coverage at a lower deposition temperature, or with better quality, compared to deposition of bulk molybdenum onto the underlying substrate in the absence of the seed layer.

A preferred seed layer can have a thickness of from 5 to 100 angstroms, e.g., 5 or 6 angstroms to 30, 40 or 50 angstroms.

A preferred molybdenum carbide seed layer can comprise, consist of, or consist essentially of molybdenum and carbon in an atomic ratio in a range from 1:99 to 60:40, e.g., from 4:96 to 40:60 (carbon:molybdenum). A seed layer that consists essentially of carbon and molybdenum refers to a seed layer that contains not more than 1 percent (atomic), e.g., not more than 0.5, 0.1, or 0.01 percent (atomic) of any material other than carbon and molybdenum. The molybdenum carbide seed layer will contain a substantial amount of molybdenum and carbon in the form of Mo$_2$C, MoC, or both, as opposed to metallic molybdenum.

The substrate onto which a molybdenum carbide seed layer is deposited may be any substrate, e.g., as described herein, including, as one particular example, a three-dimensional substrate having a titanium nitride surface.

A method as described can be performed in a deposition chamber that contains, during use, substantially only the gaseous precursor, optional carrier gas, additional inert gas, and one or more reactant gases, e.g., an interior of a deposition chamber may be supplied with and contain an atmosphere that comprises, consists of, or consists essentially of the gaseous precursor, optional carrier gas, and reactant gas. For purposes of the present disclosure, a deposition chamber or related gas flow or combination of gas flows that consists essentially of a specified combination of gaseous materials (e.g., precursor vapor, optional carrier gas, and reactant gas) is considered to contain the specified combination of gaseous materials and not more than an insubstantial amount of any other gaseous material, e.g., not more than 5, 2, 1, 0.5, 0.1, 0.05 percent (by mass) of any other gaseous material.

The amount of gaseous precursor (a.k.a., precursor vapor) and the amount of reactant gas supplied to a deposition chamber can be amounts of each that will be useful to deposit onto a substrate surface a desired amount and composition of molybdenum, e.g., as molybdenum carbide. The amounts and relative amounts of the two gases, in terms of their respective flow rates, can be selected based on factors that include the desired form and composition of the deposited seed layer, the nature (e.g., shape) of the substrate, the desired deposition rate, the substrate temperature, the size (volume) of the deposition chamber, and the interior pressure of the deposition chamber.

According to non-limiting examples of certain methods that have been identified as being useful, a flow rate of molybdenum precursor may be in a range from 2 to 20 micromoles per minute, this rate being based on a deposition chamber having a volume in a range from 2,000 to 20,000 cubic centimeters, and operating at an interior pressure in a range from 10 to 50 Torr. Consistent with these values and other parameters, a precursor vapor can be contained in a carrier gas as described at any useful or desired concentration, such as in a range from 80 to 25,000 parts per million (ppm).

According to non-limiting examples of certain methods that have been identified as being useful, a flow rate of reactant gas, e.g., hydrogen, can be in a range from 8,000 to 25,000 micromole per minute, this rate being based on a deposition chamber having a volume in a range from 2,000 to 20,000 cubic centimeters, and operating at an interior pressure in a range from 10 to 50 Torr.

An internal pressure of the deposition chamber can be one that is effective for deposition of molybdenum as a seed layer. Typically, a deposition chamber used for chemical vapor deposition operates at a pressure that is below ambient pressure, e.g., below or well below 760 torr. Useful or preferred methods of the present description, for depositing a molybdenum carbide seed layer, can be performed with a deposition chamber pressure that is substantially below atmospheric pressure, such as below about 200 Torr, e.g., a pressure that is not greater than 50, 80, or 100 Torr, such as in a range from 5, 10, or 15 up to 20, 30, 40, or 50 Torr.

A substrate, during deposition, can be held at any temperature that is effective for depositing molybdenum carbide onto the substrate as a seed layer. According to particular example methods, molybdenum can be deposited onto a substrate as a molybdenum carbide seed layer by use of a desirably or advantageously low deposition temperature. Examples of useful or preferred substrate temperatures can be in a range of from 150° C. to 400° C., or in a range of from 200° C. to 300° C., preferably a temperature of not greater than 250° C. or 270° C., during a step of depositing a molybdenum carbide seed layer.

Applicant has determined that the presence of a molybdenum carbide seed layer deposited using a bis(alkyl-arene) molybdenum precursor, e.g., bis(ethyl-benzene) molybdenum, allows for useful or advantageous further processing of the substrate during a step of depositing elemental molybdenum onto the seed layer. In specific methods, a step of depositing elemental molybdenum onto a seed layer that was deposited using a bis(alkyl-arene) molybdenum precursor, e.g., bis(ethyl-benzene) molybdenum, can be performed at a desirably or advantageously low temperature. As a result, a deposited layer of elemental molybdenum can have desirable or advantageous conformality when deposited onto a three-dimensional substrate surface in combination with other desired functional properties of an elemental molybdenum structure, including a low resistivity and good uniformity.

Thus, according to methods as described for depositing a molybdenum carbide seed layer using a precursor that contains bis(ethyl-benzene) molybdenum (e.g., $(EtBz)_2Mo$), after the seed layer is deposited onto the substrate, elemental molybdenum may be deposited onto the seed layer. The term elemental molybdenum refers to molybdenum that has a metallic structure; the elemental (metallic) molybdenum is conductive but may include non-molybdenum such as carbon, e.g., at not more than 5, 3, 2, or 1 atomic percent.

The elemental molybdenum can be deposited by use of any molybdenum precursor, such as a bis(ethyl-arene) molybdenum precursor (e.g., $(EtBz)_2Mo$), or another molybdenum precursor found to be useful for depositing molybdenum. Examples of other precursors include molybdenum halide and molybdenum oxyhalide precursors, e.g., molybdenum pentachloride ($MoCl_5$), molybdenum oxytetrachloride ($MoOCl_4$), and molybdenum hexafluoride ($MoF_6$). The halide and oxyhalide precursors have been shown to be especially useful at depositing very high purity metallic molybdenum films that have very low resistivity. However, the nucleation of Mo metal films onto TiN or other desired substrate surfaces may be potentially limited. Thus, a seed layer as described can be effective as a means to allow for improved deposition of elemental molybdenum by use of a molybdenum halide or oxyhalide precursor.

The deposited elemental molybdenum can have in metallic form, and can have a high purity or a very high purity, e.g., at least 95, 98, 99, 99.5, 99.9, or 99.99 percent (atomic) molybdenum, or greater. An amount of non-molybdenum materials, i.e., general impurities in a layer of deposited elemental molybdenum, can preferably be below 5, 2, 1, 0.5, 0.1, or 0.01 percent (atomic) for all such non-molybdenum impurities. Specific impurities such as hydrogen, chlorine, oxygen, nitrogen, carbon, and fluorine can preferably be present at levels that are below $1 \times 10^{20}$ atoms per cubic centimeter of deposited molybdenum (for hydrogen and chlorine), e.g., below $1 \times 10^{21}$ atoms per cubic centimeter of deposited molybdenum (for oxygen and carbon).

Example methods can deposit elemental (metallic) molybdenum by use of a molybdenum halide or molybdenum oxyhalide precursors, e.g., molybdenum pentachloride ($MoCl_5$), molybdenum oxytetrachloride ($MoOCl_4$), and molybdenum hexafluoride ($MoF_6$), onto a molybdenum carbide seed layer as described, applied from a bis(alkyl-arene) molybdenum precursor. The elemental (metallic) molybdenum can be applied by use of the molybdenum halide or molybdenum oxyhalide precursors, at a deposition temperature (i.e., substrate temperature) that is below 800, 700, or 500 degrees Celsius, e.g., below 450 or below 400 Celsius.

The layer of deposited elemental molybdenum can have a low resistivity, such as a resistivity of not greater than 20 $\mu\Omega\cdot cm$, or not greater than 15 $\mu\Omega\cdot cm$, for a molybdenum film having a thickness of 40 nanometers.

The layer of deposited elemental molybdenum can be of any desired thickness, e.g., of a thickness in a range from 30 to 500 angstroms, or from 40 to 400 angstroms.

In various example embodiments of the described methods, molybdenum is deposited as a seed layer onto a three-dimensional (e.g., high aspect ratio) surface of a substrate that contains titanium nitride, by contacting the substrate surface with bis(ethyl-benzene) molybdenum in the presence of a carrier gas and hydrogen as a reactant gas, under conditions to cause molybdenum to become deposited as a molybdenum carbide barrier layer. The deposition temperature during deposition of the seed layer, i.e., the temperature of the substrate during deposition, can be below about 300, 270, or 250 degrees Celsius.

In a following step, molybdenum is deposited onto the substrate surface, over the seed layer, by a deposition process that uses a precursor such as $MoOCl_4$, $MoCl_5$, or $MoF_6$. Advantageously, the step of depositing elemental molybdenum onto the seed layer derived from the bis(ethyl-benzene) molybdenum can be carried out with desired or advantageous results (e.g., conformality of the elemental molybdenum), at a favorably low process (substrate) temperature and a useful deposition rate.

FIG. 1, for example, shows a comparison of deposition rates of steps of depositing elemental molybdenum onto three substrates, one substrate having a surface of TiN with no nucleation layer, one substrate having a surface of boron (B) as a nucleation layer deposited with $B_2H_6$ precursor onto titanium nitride, and one substrate having a surface of molybdenum carbide deposited over titanium nitride as a seed layer by use of a bis(ethyl-benzene) molybdenum as a precursor. The substrate that includes the molybdenum carbide seed layer deposited by use of a bis(ethyl-benzene) molybdenum precursor allowed for effective deposition rates of elemental molybdenum at relatively lower temperatures compared to the substrate having a surface of TiN, and compared to the substrate having a surface of boron as a nucleation layer.

Figure 2:
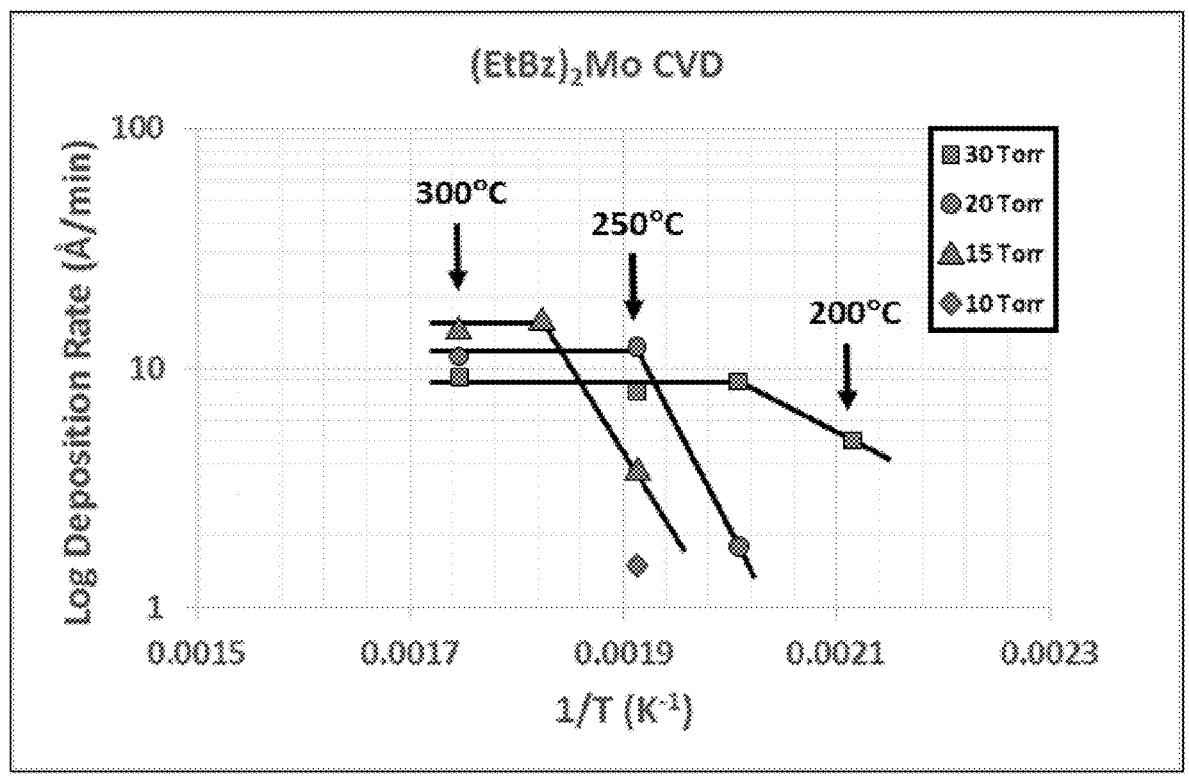
FIG. 2 illustrates deposition rates of molybdenum (from bis(ethyl-benzene) molybdenum) at various temperature and pressure conditions during vapor deposition.

FIG. 2 shows examples of processes of depositing molybdenum carbide as a seed layer onto a substrate having a titanium nitride surface, at various pressure and temperature conditions, resulting in a range of deposition rates. Pressures between 10 to 30 Torr, and temperatures between 200 and 300 degrees Celsius, are shown to be effective, with a combination of 30 Torr and 200 degrees Celsius being particularly useful for conformal molybdenum carbide seed layer deposition. Films deposited at the lower temperatures had particularly good conformality. Films deposited at higher temperature did not exhibit the same advantageous conformality, but may still be useful as seed layers on less complicated structures where covering the entire surface is less challenging.

Generally, as described herein, molybdenum deposited using a bis(alkyl-arene) molybdenum compound, e.g., $(EtBz)_2Mo$), may be deposited onto any desired substrate surface, such as a surface of a semiconductor or microelectronic device substrate, and may be adapted to perform any useful function as part of a device, or to facilitate processing of a device. Examples of functions of molybdenum deposited using a precursor as described include: as a nucleation or "seed" layer, as a barrier layer, or as a conductive layer (e.g., as an interconnect or "via"), among others. The deposited molybdenum may have features such as composition and thickness that are effective to perform a desired function.

Examples of substrates and surfaces upon which molybdenum, in various forms, may be deposited using a precursor as described include any two-dimensional or three-dimensional structure, with particular examples including microelectronic device substrates such as a DRAM device, a 3D NAND device, or another device having surfaces in three dimensions with a high aspect ratio. In particular examples, the molybdenum may be deposited by use of a precursor as described herein, as a seed layer over a three-dimensional surface (e.g., coated with titanium nitride) followed by deposition element elemental molybdenum over the seed layer, using any precursor. The substrate may include a high aspect ratio opening such as a via, in which a molybdenum carbide seed layer is first applied, followed by filling the opening with elemental molybdenum. The opening may for example have an aspect ratio of depth to lateral dimension that is in a range of from 2:1 to 200:1, e.g., from 5:1 to 100:1, or from 20:1 to 30:1. Alternately, surfaces of a 3D NAND device substrate may include titanium-nitride-coated vertical walls separated by wells, the walls including horizontally-extending ribs and pockets, and the method can include forming a uniform and conformal layer (or "film") of molybdenum carbide seed layer over the titanium nitride surfaces of the ribs and pockets, followed by depositing elemental molybdenum over the seed layer. By particular example methods, the elemental molybdenum may be deposited using a precursor such as $MoOCl_4$, $MoOCl_5$, or $MoF_6$, to provide a layer of elemental molybdenum having good, useful, or advantageous conformality.

According to certain useful or presently preferred embodiments of methods as described, for depositing molybdenum carbide onto a substrate surface as a seed layer from a bis(alkyl-arene) molybdenum precursor, useful (non-limiting) process parameters include the following (the specified values are said to be non-limiting because methods as described generally herein may be capable of being used when operating at values of these parameters that are outside of the stated ranges, depending on overall process features):

Temperature of molybdenum precursor vapor passing into a deposition chamber: 100 to 140 degrees Celsius;

Temperature of substrate: below 300 degrees Celsius, e.g., from 200 to 250 or 270 degrees Celsius;

Deposition chamber pressure during deposition step: 10 to 50, e.g., 10 to 20 Torr;

Flow rate of precursor-carrier gas mixture: 20 to 100 sccm (standard cubic centimeters per minute;

Flow rate of reactant gas (e.g., hydrogen): 100 to 1,000 sccm.

In these example methods, after depositing the seed layer, elemental molybdenum may be deposited onto the seed layer using a precursor such as $MoOCl_4$, $MoOCl_5$, or $MoF_6$. Examples of useful (non-limiting) process parameters include the following (the specified values are said to be non-limiting because methods as described generally herein may be capable of being used when operating at values of these parameters that are outside of the stated ranges, depending on overall process features):

Temperature of molybdenum precursor passing into a deposition chamber: 30 to 100 degrees Celsius;

Temperature of stage (substrate): 300 to 800 degrees Celsius;

Deposition chamber pressure during deposition step: 10 to 100, e.g., 20 to 80 Torr;

Flow rate of precursor-carrier gas mixture: 20 to 1000 sccm;

Flow rate of reactant gas (e.g., hydrogen): 500 to 5,000 sccm.

What is claimed is:

1. A method of forming a molybdenum-containing material on a substrate, the method comprising contacting the substrate with bis(alkyl-arene) molybdenum vapor under chemical vapor deposition conditions to deposit a molybdenum carbide seed layer having a thickness in a range of from 6 to 100 angstroms on the substrate followed by depositing a layer of metallic molybdenum onto the molybdenum carbide seed layer wherein the molybdenum carbide seed layer comprises $Mo_2C$ or MoC and where the molybdenum carbide seed layer consists essentially of molybdenum carbide.

2. The method of claim 1 wherein the bis(alkyl-arene) molybdenum is bis(ethyl-benzene) molybdenum ($(EtBz)_2Mo$).

3. The method of claim 1, wherein the molybdenum carbide seed layer comprises carbon and molybdenum in an atomic ratio of from 1:99 to 60:40 (carbon:molybdenum).

4. The method of claim 1 comprising depositing the molybdenum carbide seed layer onto the substrate by chemical vapor deposition at a substrate temperature that is not greater than 300 degrees Celsius.

5. The method of claim 1 comprising depositing the molybdenum carbide seed layer onto the substrate in a deposition chamber having an internal pressure between 10 and 50 Torr.

6. The method of claim 1, wherein the molybdenum carbide seed layer comprises carbon and molybdenum in an atomic ratio of from 4:96 to 40:60 (carbon:molybdenum).

7. The method of claim 1, wherein the molybdenum carbide seed layer is deposited onto a surface of the substrate that includes titanium nitride.

8. The method of claim 1, wherein the molybdenum carbide seed layer is deposited onto a three-dimensional surface of the substrate.

9. The method of claim 8, wherein the three-dimensional surface is a feature of a 3D NAND device comprising vertical walls separated by wells, the walls including horizontally-extending ribs and pockets, and the method comprises depositing the layer of metallic molybdenum over surfaces of ribs and pockets.

10. The method of claim 8, wherein the three-dimensional surface includes an opening having an aspect ratio of depth to lateral dimension that is in a range of from 2:1 to 200:1.

11. The method of claim 1, wherein the metallic molybdenum is derived from molybdenum halide precursor or molybdenum oxyhalide precursor.

12. The method of claim 1, wherein the metallic molybdenum is derived from precursor selected from molybdenum pentachloride ($MoCl_5$), molybdenum oxytetrachloride ($MoOCl_4$), and molybdenum hexafluoride ($MoF_6$).

13. The method of claim 1 comprising depositing the metallic molybdenum onto the substrate by chemical vapor deposition at a substrate temperature that is below 500 degrees Celsius.

14. The method of claim 1, wherein the metallic molybdenum has a thickness of at least 50 angstroms.

15. A method of forming a molybdenum-containing material on a substrate, the method comprising:
 contacting the substrate with bis(alkyl-arene) molybdenum vapor under chemical vapor deposition conditions to deposit a molybdenum carbide seed layer having a thickness in a range of from 6 to 100 angstroms on the substrate, wherein the molybdenum carbide seed layer consists essentially of molybdenum carbide; and
 depositing a layer of metallic molybdenum onto the molybdenum carbide seed layer.

16. The method of claim 15, wherein the deposition of the metallic molybdenum onto the molybdenum carbide seed layer occurs at less than 500 degrees Celsius.

17. The method of claim 15, wherein the molybdenum carbide seed layer is deposited on a titanium nitride substrate.

\* \* \* \* \*